(12) United States Patent
Poplack et al.

(10) Patent No.: US 10,324,740 B1
(45) Date of Patent: Jun. 18, 2019

(54) ENHANCED CONTROL SYSTEM FOR FLEXIBLE PROGRAMMABLE LOGIC AND SYNCHRONIZATION

(71) Applicant: CADENCE DESIGN SYSTEMS, INC., San Jose, CA (US)

(72) Inventors: Mitchell G. Poplack, San Jose, CA (US); Yuhei Hayashi, San Jose, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 715 days.

(21) Appl. No.: 14/854,813

(22) Filed: Sep. 15, 2015

(51) Int. Cl.
*G06F 9/455* (2018.01)

(52) U.S. Cl.
CPC .................. *G06F 9/455* (2013.01)

(58) Field of Classification Search
None
See application file for complete search history.

(56) References Cited

U.S. PATENT DOCUMENTS

| | | | | |
|---|---|---|---|---|
| 6,574,590 B1* | 6/2003 | Kershaw | ............ | G06F 11/3656 703/23 |
| 6,747,997 B1* | 6/2004 | Susnow | ............... | H04L 7/0083 370/503 |
| 7,117,143 B2* | 10/2006 | Wang | ................. | G06F 17/5027 703/25 |
| 7,363,563 B1* | 4/2008 | Hissen | .................... | H04L 1/243 327/144 |
| 7,656,325 B1* | 2/2010 | Andreev | ................ | H03K 5/135 341/100 |
| 9,367,656 B1* | 6/2016 | Quayle | ............... | G06F 17/5031 |
| 2006/0161702 A1* | 7/2006 | Bowlby | ................ | G06F 11/221 710/71 |
| 2008/0253293 A1* | 10/2008 | Beyers | ................. | H04L 43/024 370/242 |
| 2014/0157215 A1* | 6/2014 | Wang | .................... | G06F 17/505 716/105 |

OTHER PUBLICATIONS

Beckert et al. "A Run-Time Scheduling Framework for a Reconfigurable Hardware Emulator" 2007, IEEE, 10th Euromicro Conf on Digital System Design Architectures, Methods, and Tools. 4 pages.*
Abdellah-Medjadji et al., "Large Scale On-Chip Netowrks: An Accurate Multi-FPGA Emulation Platform", 2008 IEEE, 11th Euromicro Conf on Digital System Design Architectures, Methods and Tools, pp. 3-9.*

(Continued)

*Primary Examiner* — Aniss Chad
*Assistant Examiner* — Bernard E Cothran
(74) *Attorney, Agent, or Firm* — Eric L. Sophir; Dentons US LLP

(57) ABSTRACT

A control-circuit of an emulation system may include one or more serial link inputs communicatively coupled to a serial bus, a serial link input receiving an input control bit from the serial bus. A configurable logic circuit may be configured to receive multiple control bits from the one or more serial link inputs, execute one or more operations on the plurality of input control bits according to programmable logic, and transmit an output control bit to a serial output link.

18 Claims, 6 Drawing Sheets

(56) References Cited

OTHER PUBLICATIONS

Xilinx, Virtex-4 Family Overview Porduct Specification, Aug. 30 2010, 9 pages.*
Xilinx, Virtex-4 FPGA User Guide, Dec. 1, 2008, 406 pages.*
Dan Sides & Bertrand Leigh, "SERDES Interfaces in an FPGA World: What Do I Need to Know to Get Started?" Lattice Semiconductor, pp. 1-7, Jun. 20, 2007 (https://www.ecnmag.com/product-release/2007/06/serdes-interfaces-fpga-world-what-do-i-need-know-get-started). (Year: 2007).*

* cited by examiner

ENHANCED CONTROL SYSTEM FOR FLEXIBLE PROGRAMMABLE LOGIC AND SYNCHRONIZATION

TECHNICAL FIELD

This application relates generally to controlling electrical design emulation.

BACKGROUND

Emulation systems may include hardware components inclusive of processor-based (i.e., hardware-based) emulation chips. By executing various forms of programmable logic on the processor-based emulation chips, the emulation chips may be designed to mimic the functionality of nearly any ASIC or logic system design that is undergoing testing. Such hardware emulation systems may include hundreds or thousands of processors that collectively simulate the functionality of a logic system. In many cases, these ASICs may be synchronous ASICs. As understood in the art, the cost of building an ASIC is very expensive, so using an emulation system is a much less expensive and more reliable way of verifying a logic system before building an ASIC. As further understood in the art, emulators may also be software-based, but software simulations are significantly slower than hardware emulators.

Because of the complexity of hardware-based emulation systems, however, the ability to control and manage development of virtual logic (i.e., emulated hardware of an ASIC being designed and tested by the hardware of the hardware-based emulation system) is a way for the designer (i) to ensure synchronization of each of the chips that are to be synchronized during an emulation, and (ii) to test and debug the virtual logic. Historically, the use of field programmable gate arrays (FPGAs) that were positioned in control paths were used for managing synchronization of emulation testing devices and debugging of the virtual logic being emulated. As understood in the art, the FPGAs were preprogrammed as desired to handle desired control of hardware and signaling in the emulator, and programming the FPGAs allowed for easy control of the emulator to handle the synchronization, testing, and debugging. However, with an emulator design that does not include FPGAs positioned in the control or data paths due to not using FPGAs throughout the hardware-based emulator, there is no ability to provide for synchronization of emulation devices and testing and debugging of the virtual logic on the hardware-based emulator. Accordingly, there is a need to provide for the ability to synchronize emulation devices and test and debug virtual logic on a hardware-based emulator without an FPGA in control and data paths of the emulator.

SUMMARY

Disclosed herein are systems and methods of providing control of an emulator system using an enhanced control system. The enhanced control system may be configured within each chip of the emulator system to perform a variety of control operations. One such function may include applying embedded control bits onto a serial stream between chips of the emulator system between and during emulated user clock cycles. By embedding the control bits in an unscheduled manner (i.e., not on a clock cycle), data for use by the chips may be in position prior to an emulation or clock cycle in which each of the chips are clocked. The enhanced control system may further be used to synchronize with other enhanced control systems on other chips, stepping a process on a chip to provide for debugging capabilities, identifying breakpoints to stop a check from running, and so on.

One embodiment of a control-circuit of an emulation system may include one or more serial link inputs communicatively coupled to a serial bus, a serial link input receiving an input control bit from the serial bus. A configurable logic circuit may be configured to receive multiple control bits from the one or more serial link inputs, execute one or more operations on the plurality of input control bits according to programmable logic, and transmit an output control bit to a serial output link.

One embodiment of a processor-implemented method of controlling an emulator may include receiving, by a control circuit of an emulation system, one or more input control bits from a serial bus. One or more operations may be executed by the control circuit on the one or more input control bits according to programmable logic. An output control bit may be generated by the control circuit based on the one or more operations. The output control bit transmitted by the control circuit to a serial output link.

BRIEF DESCRIPTION OF THE DRAWINGS

The accompanying drawings constitute a part of this specification and illustrate an embodiment of the invention and together with the specification, explain the invention.

DETAILED DESCRIPTION

Figure 1:
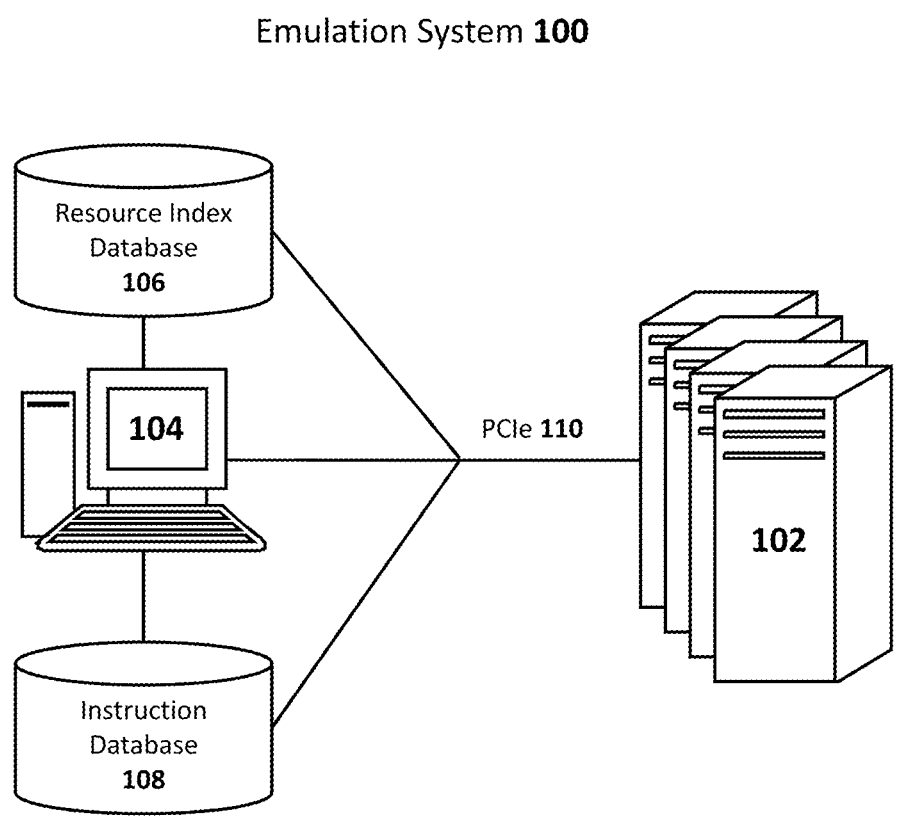
FIG. 1 is a schematic diagram of an illustrative hierarchical configuration of components in an illustrative emulation system.

The present disclosure is here described in detail with reference to embodiments illustrated in the drawings, which form a part here. Other embodiments may be used and/or other changes may be made without departing from the spirit or scope of the present disclosure. The illustrative embodiments described in the detailed description are not meant to be limiting of the subject matter presented here.

Reference will now be made to the illustrative embodiments illustrated in the drawings, and specific language will be used here to describe the same. It will nevertheless be understood that no limitation of the scope of the invention is thereby intended. Alterations and further modifications of the inventive features illustrated herein, and additional applications of the principles of the inventions as illustrated herein, which would occur to one skilled in the relevant art and having possession of this disclosure, are to be considered within the scope of the invention.

Components of an Illustrative Emulation System
Illustrative Emulation System

FIG. 1 is an illustration including components of an illustrative emulation system 100, according to an illustrative system embodiment. The emulation system 100 may include emulation devices 102, a host computing device 104, a resource index database 106, and an instruction database 108.

Emulation device 102 may be a collection of computing hardware capable of executing emulation processes described herein. Emulation device 102 may include racks housing emulation logic boards, emulation processors, and other computing hardware designed to emulate the designs and functionality of prototype application-specific integrated circuits (ASICs) and logic systems. In some embodiments, host devices 104 may include a server computer having separate processors, which may execute software modules configured to manage and control the resources and performance of the emulation system 100. Non-limiting examples these software modules may include a complier module and a configuration manager. Other configurations of the emulation system 100 may be utilized, as well.

A compiler may be a software module, which may be executed by the host computing device 104 or on emulator devices 102, and is configured to receive and compile a netlist design file containing the logical gate design of an ASIC, and then to generate a virtual logic file based on the compiled netlist. In other words, the compiler "maps" the ASICs logic and timing of operations into the hardware components of the emulator device 102 of the emulation system 100 to generate instructions for the components of the system 100 to cause the system to function as the ASIC would function. The compiler module may include a partitioner and scheduler component or function, though it should be appreciated that the compiler may be segmented into any number of component software modules. In an opening import phase, the compiler receives the netlist and begins compiling. Here, the compiler may parse the logic gates of the netlist into a database format. A partitioner may determine which part of the netlist is going to be executed by which type of hardware resource of the system 100 and which instance. Then, a scheduler may determine for that part of the netlist which of the hardware resources should execute the part of the netlist and when in the execution cycle that logic component should be executed. The compiler may be capable of determining the status of components of the system 100, including the allocation status or whether the resource is broken (i.e., marked-out). In some cases, the compiler tracks the netlist in a memory of the device executing the compiled netlist; and, in some cases, the compiler may query a resource index database 106 that stores status data.

A configuration manager may be software module, which may be executed by the host computing device 104 or emulation device 102, and is configured to track the status and control the tasks performed of components of the system 100. The configuration manager may determine which components of the system 100 are available or unavailable to receive parts of the virtual logic generated by the compiler. In some cases, the configuration manager continuously polls or self-tests the emulation system 100 for faulty hardware components. The configuration manager may then update records of the components stored in a resource index database 106. In some cases, the configuration manager may determine the status of components of the system 100 when the virtual logic is being loaded into the hardware components of the emulation system 100. The determination may be based on querying a resource index database 106 or other stored file containing data about the status of hardware components (e.g. marked-out list). In some embodiments, the configuration manager may determine whether the instructions of the virtual logic should be revised (i.e., moved, transformed) from the instructions that were originally compiled. The configuration manager may be configured to automatically make this determined, or may receive instructions from an administrator through a GUI or comment line to review and revise the complied instructions.

In some cases, these software modules may be executed in whole or in part on the host computing device 104, such as an administrator or user computer, which may communicate data and instructions associated with the respective software module to and from the emulation device 102. For example, in some cases, the host computing device 104 may execute a compiler module that allows a user to input a netlist design file, containing logic gate designs of the prototype ASIC or logic system, and then compiles the netlist file. The resulting virtual logic may then be transmitted or downloaded to emulation device 102 via a peripheral component interconnect express (PCIe) bus or other communications bus 110, and may execute a configuration manager module configured to track the availability of resources within the emulation system 100. It should be appreciated that the computing device 104 may be any computing device including a processor and non-transitory machine-readable storage that render the computing device 104 capable of performing the various tasks and processes described herein. Non-limiting examples of computing devices 104 may include workstation computers, laptops, tablets, server computers, and the like.

An instruction database 108 may store records of virtual logic or instruction sets compiled by the compiler from netlist files. The instruction database 108 may be hosted in non-transitory machine-readable storage medium of any computing device capable of hosting the instruction database 108 and performing the various tasks and processes associated with the instruction database 108, as described herein. The instruction database 108 may receive, from the host computing device, 104 executing the compiler, instructions compiled from the netlist file of an ASIC or logic system. In some cases, the instructions may contained within a virtual logic file generated by the compiler. At download time, when the hardware components of the emulation system 100 are loaded with the instructions, the instruction database 108 may transmit or otherwise provide the instructions to the components at which point the emulation devices 102 receive the instruction sets and the instruction sets are loaded into the memories of the respective hardware components within the emulation logic boards.

A resource index database 106 may be a database or a machine-readable computer file (e.g., marked-out list) containing records for components of the emulation system 100. The resource index database 106 or similar resource may be hosted in non-transitory machine-readable storage medium of any computing device capable of hosting the resource index database 106 and performing the associated tasks and processes described herein. The records may indicate various types of status information about components, such as allocation status, availability status (e.g., busy, broken, incompatible), execution status (e.g., busy, idle), and the like. The resource index database 106 may be periodically updated by modules of the system (e.g., configuration manager) or manually by a user, using a computing device 104. The resource index database 106 may also be queried by modules throughout the emulation process.

Figure 2:
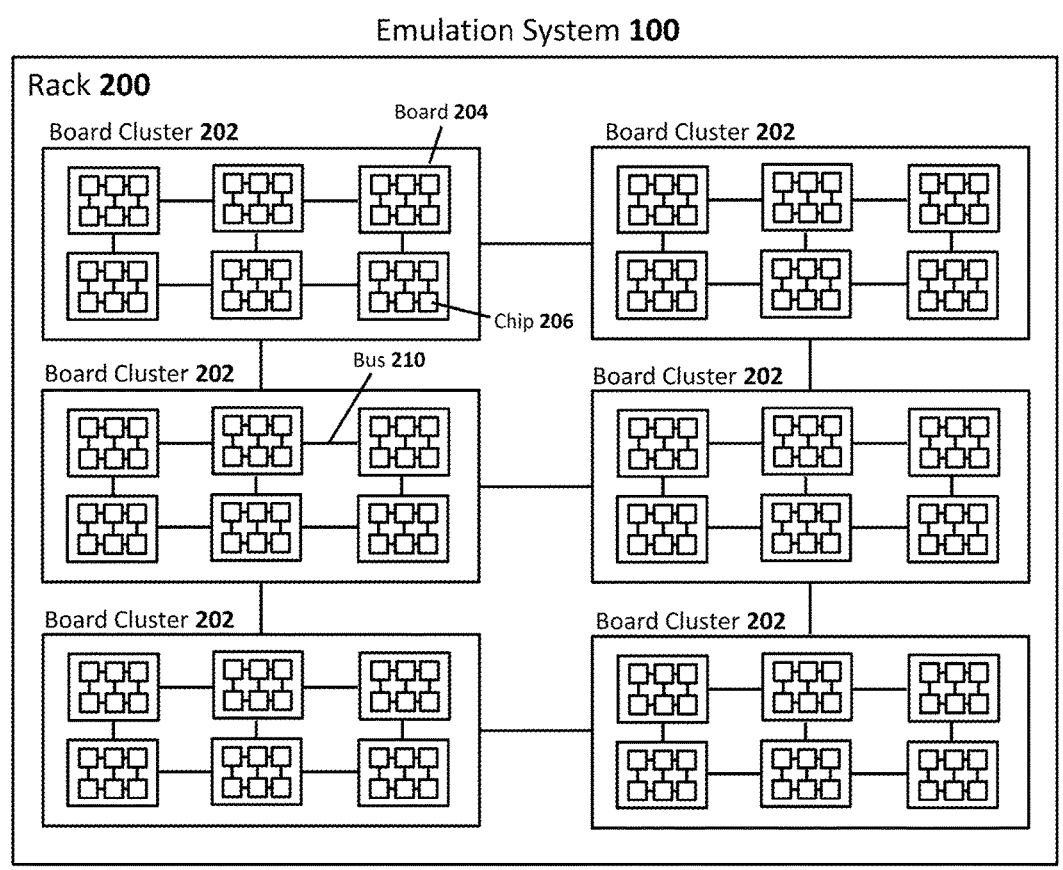
FIG. 2 is a schematic diagram showing an illustrative hierarchical configuration of components of the emulation system.

With regard to FIG. 2, a schematic diagram showing an illustrative hierarchical configuration of components of the emulation device 102 of the emulation system 100 is shown. Emulation systems 100 may include one or more racks 200, board clusters 202, logic boards 204, emulation chips 206, and buses of various types to carry data signals between the various components of the system 100.

A rack 200 may be any physical housing for components of an emulation system 100. In the illustrative system 100, the rack 200 houses a plurality of emulation logic boards 204 that are organized into board clusters 202. In the system 100, there is only one rack 200, however, some other embodiments may include multiple racks 200. In some cases, the rack 200 may be a computing device, such as a server computer or workstation computer, configured to implement various emulation functions. The rack 200 may physically house components of any type, such as board clusters 202, emulation logic boards 204, emulation chips 206, and buses hosting data signal communications.

Board clusters 202 may be logical and/or physical collectives of one or more logic boards 204. Logic boards 204 may be clustered for any number of reasons, such as creating proximity among a set of boards 204 for more efficient signal transfer and processing between the boards 204 of the cluster 202. It should be appreciated that clustering logic boards 204 is often a design consideration, and, as such, other embodiments may cluster and/or disaggregate logic boards 204 according to any number of different organizational patterns. As shown in FIG. 2, the system 100 includes six board clusters 202, each of the board clusters 202 including six logic boards 204. The board clusters 202 may be interconnected with one another by buses 208 that may carry data signals transmitted to and from the board clusters 202. In one embodiment, the buses 208 are serial buses. The buses 208 may interconnect the logic boards 204 of a particular board cluster 202, so that the logic boards 204 may transmit and receive data signals to and from other logic boards within the same board cluster 202.

Emulation logic boards 204 may include computing hardware components capable of emulation functionality to emulate the design and functions of an ASIC or other circuitry; non-limiting examples of emulated logic systems might include ASICs, CPUs, GPUs, and ALUs, among others. The logic board 204 may comprise one or more emulation chips 206 performing the functions used for emulation, and one or more buses (not shown) interconnecting the emulation chips 206. The buses 208 may be an optical, copper, or any other conductive material capable of carrying data signals. In operation, the buses 208 may carry data signals transmitted to and from the emulation chips 206 of the logic board 204. In some cases, the logic board 204 may include one or more buses 210 supporting communication between emulation chips 206 on the same logic board 204 (i.e., intra-board communication); and, in some cases, the logic board 204 may include one or more buses 208 supporting communication between emulation chips 206 located on other logic boards 204 of the system 100 (i.e., inter-board communication).

Emulation chips 206 may include any number of processors capable of performing the various tasks and processes for emulating an ASIC or other logical processing circuitry, multiplexers configured to direct data signals to and from the processors, buses for communicating data between the processors, and data lanes connecting the components of a processor. An emulator chip 206 may be designed to mimic the functionality of any logic design, based on programmable logic that configures the behavior of the emulator chips 206 to mimic the particular ASIC. In this way, circuitry designers may prototype new logic system design, such as an ASIC design, using processor-based emulation, before actually manufacturing the ASIC and host device. The emulation chips 206 may receive a set of instructions to execute from a compiler, which may be a software module component executed by a computing device. In operation, the compiler compiles a netlist file representing the ASIC's design. The result of compiling the netlist generates virtual logic comprising instruction sets for the components (e.g., multiplexers, Boolean processors, etc.) of the emulator chips 206.

In some embodiments, the processors of the emulator chip 206 may be organized into any number of processor clusters (not shown) to efficiently share data inputs, data outputs, and data references (e.g., calls to stored data in a data array). For example, multiple processors of an emulator chip 206 may be clustered together such that the processors reference the same data array and/or instruction store. It should be appreciated that, due the modular nature of the components of the system 100, components such as the processors may be organized into any number of additional or alternative organizational patterns. In some cases, clusters of processors may be clustered into clusters of clusters. However, it should be appreciated that organizational patterns are not required, and thus, in some embodiments, processors of an emulator chip 206 may not be organized into clusters at all.

As will be described further herein, each of the chips 206 may be provided with an enhanced control system (ECS) (not shown) that provides for control of operations of the individual chips 206 and communications between chips 206. As understood in the art, the chips 206 operate on clock cycles that enable each of the chips 206 to be synchronized. Certain aspects of the ECS enable communications between the chips 206 between the clock cycles to provide for execution, delays, testing, and debugging, and other features.

Architechural Overview

Figure 3:
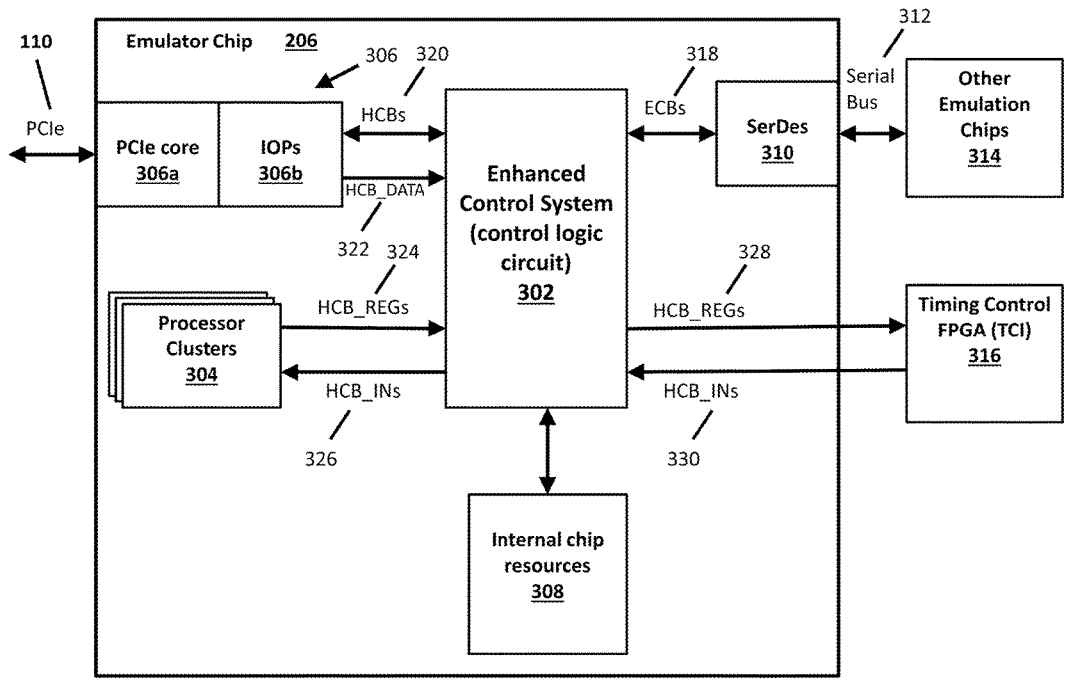
FIG. 3 is a schematic diagram of an illustrative emulation chip inclusive of an enhanced control system (ECS) or control logic circuit used to control operation of an emulation of virtual (emulated) logic using a hardware-based emulation system as described herein.

With regard to FIG. 3, a schematic diagram of an illustrative emulation chip 206 inclusive of an enhanced control system (ECS) or control logic circuit 302 used to control operation of an emulation of virtual (emulated) logic using a hardware-based emulation system as described herein is shown. The emulator or emulation chip 206 is further shown to include (i) a set of processor clusters 304, (ii) input/output hardware 306 inclusive of a peripheral component interconnect express (PCIe) core 306a and input/output processors 306b in communication with a PCIe bus 110, (iii) internal chip resources 308, and serializer/deserializer (SerDes) 310, each of which is in communication with the ECS 302.

The processor clusters 304 include multiple processors. Clustering may facilitate expansion of the capabilities of the emulation system because the processors may have limitations on the number of ASIC gates that the processors can emulate. In some cases, the processor clusters 304 may be more efficient in prototyping ASIC functions because of the increased processing power and functionality. For example, a single processor may be able to emulate, at most, 1,280 logic gates (i.e., logical processes), but the ASIC currently being tested has several million gates, all of which need to be emulated for thorough testing. In some embodiments, clusters of processors may be clustered into "clusters of clusters." Clustered processors communicate with each other by sending output data to other processors in the cluster.

The IOPs 306b may be a microcontroller or other processing device that may be configured with customized program(s) to perform certain functions related to inputs and outputs of the PCIe bus 110. As an example, the IOPs 306b may monitor when certain data is received or otherwise being communicated over the PCIe bus 110.

The SerDes 310 may be an integrated circuit that operates as a transceiver that converts data from parallel-to-serial and vice versa for communication of the data over a serial bus 312 with other emulation chips 314. Also shown is a timing control field programmable gate array (FPGA) or timing controller 316. The timing control FPGA 316 includes step generators (not shown) that may be used to control synchronization of the processor clusters 304 and other hardware, such as a global multiplexer (not shown) that is used to coordinate signaling between processor clusters 304, input multiplexer (IMUX), output multiplexer (OMUX) (collectively, but not limited to, referred to as emulator circuits), as further provided herein (see, for example, FIG. 4).

Embedded Control Bits

The ECS 302 is used to control certain operations of the emulator system 100. Such control may provide for, but not limited to, synchronization, testing, and debugging. In controlling the emulator system 100, the ECS 302 and other hardware on the emulation chip 206 may use embedded control bits (ECBs) 318 and a variety hardware control bits (HCBs). Embedded control bits 318 provide for data to be transmitted between ECSs on different emulation chips 302 and 314 while not executing clock cycles that would cause the entire emulation system 100 to step forward. Such a communication of ECBs between ECSs and between clock cycles is considered to be a communication of an unscheduled control bit, where communication of a control bit on a clock cycle would be considered to be scheduled. One reason for using ECBs 318 to communicate data between clock cycles is because latency of data being communicated via the PCIe bus 110 cannot be determined (e.g., data being communicated to the emulation chip 206. Other reasons for using ECBs 206 also exist and are described further herein. As shown, ECBs 302 may be communicated via the SerDes 310 for communication over the serial bus 312 to the other emulation chips 314. The ECBs 318 may be generated or sourced by the ECS 302 or by another ECS (not shown) on one of the other emulation chips 314. In one embodiment, the ECBs 318 are unscheduled bits that are communicated in a serial data stream. In being unscheduled, the ECBs 318 are communicated between emulator clock cycles, which cause each of the processors of the processor clusters 304 to be synchronized. By communicating between the clock cycles, the ECBs 318 can enable the ECSs 302 to perform control functionality without stepping the processor clusters 304. In operation, scheduled control bits as scheduled by a scheduler of a compiler may additionally be communicated on the serial bus 312 and the ECS 302 may process those scheduled control bits in the same or simular manner as the ECBs 318 that are unscheduled.

Hardware Control Bits

In one embodiment, there are up to 128 different HCBs defined for the emulator system 100 on which the emulator chip 206 may operate. The HCBs are controllable via virtual logic being executed by the processors of the processor clusters 304. HCBs may be local or global, and be used to affect hardware resources in their own octant (e.g., processor clusters 304) or be global to the emulator chip 206. The HCBs may affect sequencers (not shown), timing, or other functionality, as further described herein, based on values of the HCBs. Each sequencer may be configured to be responsive to HCBs and combinations of HCBs, for example. The sequencers may operate in parallel to give the illusion of multiple hardware domains acting as one logical domain.

As shown, there are a number of HCBs being communicated between different hardware elements on the emulator circuit on the emulator chip 206. Between the IOPs 306b and ECS 302, HCBs 320 are bidirectionally communicated and HCB_DATA 322 is communicated from the IOPs 306b and ECS 302. The processor clusters 304 may be configured to communicate HCB_REGs 324 to the ECS 302 and receive HCB_INs 326 from the ECS 302, where the ECS 302 may be responsive, at least in part, to the HCB_REGs 324 and control certain functions of the processor clusters 304 through use of the HCB_INs 326. The timing control FPGA or circuit 316 may be configured to receive HCB_REGs 328 and output HCB_INs 330.

HCBs types may include a strobe, value, or paired types. The distinction of the type of HCB largely depends on the application of the hardware control signal. For example, strobe HCBs create a single positive pulse when an HCB bit (e.g., HCB_LC, not shown) is scheduled if HCB_REG is set to a logical '1'. Value HCBs take on the value of respective HCB_REGs 324 or 328 whenever HCB_LC is asserted. Paired HCBs use a pair of physical HCBs to produce a single logical bit. This pairing may be used because HCB_LC cannot be controlled by a virtual signal because the HCB_LC bit is of a certain type. In the case where scheduled logic is desired, the ability to load a new value or leave the current value, two HCB_REGs 324 or 328 may be paired together to generate a hardware control signal or HCB (e.g., HCB_INs 326).

There are a number of cases for virtual logic to interact with hardware infrastructure. Such cases may occur where (i) hardware functions are to be synchronized with the course of an emulation cycle—e.g. scheduling memory refreshes; (ii) virtual signals and design behavior are to interact—e.g. instrumentation logic for breakpoints; and (iii) naturally programmable nature of virtual logic is to be used to simplify or reduce risk in hardware implementation that is not programmable. Other cases are also contemplated.

Virtual logic can signal hardware infrastructure via the HCB_REGs 324 (HCB_REG ports) of the processor clusters 304 via various parameters or instructions and can receive signals via the HCB_INs 326 (HCB_IN ports) via a parameter or instruction. Furthermore, each of the processor clusters 304 has an HCB_DATA output port (not shown) that is used to provide a larger vector to an HCB controller within the ECS (see FIG. 5). The HCB buses may be 64 data bits. Other sized HCB buses may be utilized, as well.

HCBs 320 can also be accessed programmatically by IOPs 306b, and can be used to trigger IOP programs being executed by the IOPs 306b. HCBs are a subset of a larger, more comprehensive system for signaling among emulator chips 206 in the emulator system 100, which are further described with regard to FIG. 5 hereinbelow. Such features may include the ECBs 318, as previously described, and SYNC_IN and SYNC_OUT pins that connect to other chips on the same board without using the serial bus 312, but rather using the timing control FPGA 316.

Emulation Chip Architecture—ECS, Processor Clusters, Global Multiplexers, Output Multiplexers, and Input Multiplexers In general, an emulation chip may include a variety of multiplexers residing outside of processor clusters of the emulation chip. These multiplexers may allow for connections between outputs or inputs of certain resources, such as processors, clusters of processors, and serial buses.

Figure 4:
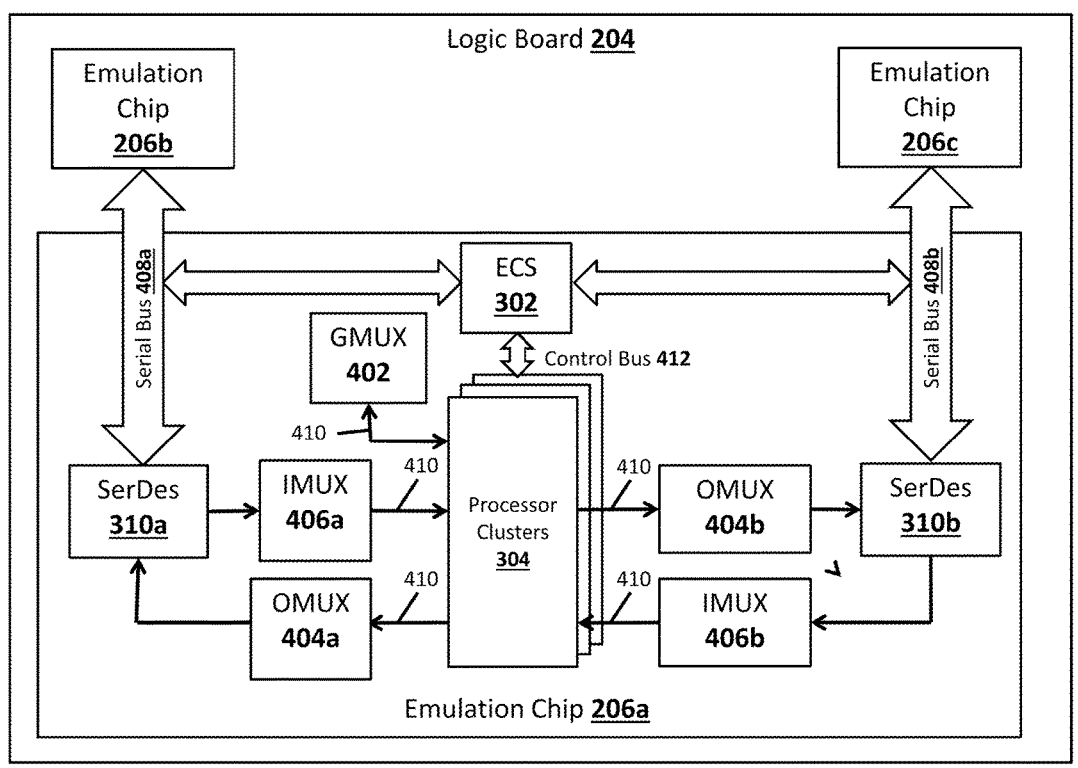
FIG. 4 is a schematic diagram of an illustrative emulation chip.

With regard to FIG. 4, a schematic diagram of an illustrative emulation chip 206a is shown. The emulation chip 206a may include processor clusters 304, an enhanced control system 302, global multiplexer (GMUX) 402, output multiplexers (OMUXs) 404a and 404b (collectively 404), input multiplexers (IMUXs) 406a and 406b (collectively 406), serializer-deserializers 310a and 310b (collectively 310), and serial buses 408a and 408b (collectively 408). In operation, processor clusters 304 may produce and transmit a set of one or more bits (represented by data signals) over data lanes 410 of the chip 400 to the GMUX 402; the GMUX 402 may, in turn, forward the one or more bits to a destination resource, which may be one of the processor clusters 304 or a particular processor within the processor clusters 304. In some cases, the destination may be located on a second emulation chip 206b or 206c. In such cases, data may be transmitted to an OMUX 404a or 404b configured to connect the processors or clusters 304 of the emulation chip 206a to the respective serial bus 408a or 408b that connects the emulation chips 206a-206c. Additionally or alternatively, in some cases, one of the processor clusters 304 or a processor of the clusters 304 may receive data from one of the other emulation chips 206b or 206c, via the serial bus 4111. In such cases, the data may be received by the respective IMUX 406a or 406b, which may also be configured to connect the processors or clusters 304 of the emulation chip 206a to the serial buses 408a. It should be appreciated that the functions and features described in this exemplary embodiment may be varied, such that additional or alternative features may included, or the features and functions may be aggregated into a fewer multiplexers, or disaggregated into additional multiplexers.

As previous described, the processor clusters 304 may be configured as a collection of one or more processors performing various logical functions associated with emulating an ASIC or logic system that is currently being prototyped by the emulation system. Each of the processor clusters 304 may include any number of processors, or clusters of clusters. For example, in some embodiments, one of the clusters 304 may include a single processor; and, in some cases, the clusters 304 may include four or eight processors, for example. In some embodiments, processor clusters 304 may include a cluster of clusters. For example, eight clusters 304 may be clustered with eight other clusters 304, to form a cluster of sixty-four processors. It should be appreciated that the chip 206a may include multiple clusters 304, each of which may have the same or different clustering pattern. In some embodiments, the processors of the clusters 304 may each execute instructions from a dedicated instruction set (i.e., an instruction set per LUT), which means that each processor may produce its own output bits. In such embodiments, the processor clusters 304 may further include a processor output multiplexer (not shown), which may determine the set of bits ultimately output by the processor cluster 304. The resulting output bits from a cluster 304 may then be transmitted to a GMUX 402 or an OMUX 404a or 404b.

Each of the processor clusters 304 may be interconnected to other clusters 304 by parallel data lanes 410, serial buses 408, or any combination of the two. Data lanes 410 and serial buses 408 may be formed of any material (e.g., copper, fiber optics, gold) capable of being a medium for transmitting data signals between clusters 304, or other resources of the chip 206a (e.g., memories). In operation, the data lanes 410 and serial buses 408 may be the medium used for transmitting a set of one or more bits (i.e., data represented by the data signals) between clusters 304 and multiplexers 402, 404, and 406. After performing Boolean functions, the clusters 304 may produce logical results (i.e., one or more binary output bits), which the cluster(s) 304 may transmit to a destination resource (e.g., memory, multiplexer) according to the instruction set or sets associated with that cluster 304. For example, after performing a series of Boolean functions, a cluster 304a (shown as the first of the processor clusters 304) may determine to, based on the instruction sets of that cluster 304a, transmit the output bits to a data memory array (not shown) for that cluster 304a, or the cluster 304a may transmit the output bits to another processor or cluster 304b (shown as the second of the processor clusters 304) in the emulation system.

Data lanes 410 may include any material capable of hosting transmitted data signals between component resources of the emulation chip 206a. Although the data lanes 410 are shown in FIG. 4 as a single line, it should be appreciated that there may be any number of parallel data lanes 410 interconnecting components of the chip 206a. Such parallel data lanes 410 may transmit a number of data signals into a single multiplexer 402, 404, or 406, which may then use to execute certain logical functions according to an instruction set being performed by the multiplexer 402, 404, or 406.

Serial buses 408 may be formed of any material capable of transmitting data signals to from the processor clusters 304 to destinations in the emulation system that are not located on the chip 206a, such as the second emulation chip 206b, an external memory drive (not shown), a second logical board (different from the logical board housing the emulation chip 206a), or any other computing resource of the emulation system that is not housed on the emulation chip 206a. In the instant embodiment, the emulation chip 206a includes multiple serial buses 408—a first serial bus 408a configured to transmit outputted data signals of the processor clusters 304 to emulation chip 206b on the logical board 204, and a second serial bus 408b configured to transmit outputted data signals of the processor clusters 304 to emulation chip 206c on a logical board 204. Serial buses 408 may be configured to convey outputted data signals in a serialized configuration. That is, data signals outputted from processor clusters 304 may arrive at the serial bus 408 via parallel data lanes 410. These data signals may then be organized into streams of data, as opposed to parallel data lanes 410, which is then transmitted over the serial bus 408 to the appropriate destination, as understood in the art.

The global multiplexer 402 may be responsible for interconnecting clusters 304 or processors on the emulation chip 206a, thereby facilitating data signal exchanges between the clusters 304. For example, the GMUX 402 may receive data inputs, outputted from a number of clusters 304, and then, based on the instruction set informing behavior of the GMUX 402, the GMUX 402 may select a data value from the inputs received from, e.g., a first cluster 304a, which the GMUX 402 then drives back into the same first cluster 304a or onward to a second cluster 304b. In some implementations, this is the main technique by which processors within each of the clusters 304 communicates data to other processors within the same or different clusters 304.

The OMUXES 404 may be responsible for routing data signals from the processor clusters 304 of the emulation chip 206a to destination resources in the emulation system not housed on the emulation chip 206a. In some cases, such data signal routing uses a serial bus 308, such that the OMUXES 404 may route data signals from processors to the serial bus 408. The OMUXES 404 may execute routing functions based on an OMUX instruction set stored in an OMUX instruction store (not shown); these OMUX functions may include receiving data from processor clusters 304 through parallel data lanes 410, selecting a set of one or more input bits from the data signals received from the clusters 304, performing one or more operations using the bits received in the data signals from the clusters 304, outputting data signals to processor clusters 304, outputting data signals to serial buses 408, and serializing data bits into a data stream when the bits are received as parallel data signals through parallel data lanes 410.

The IMUXES 406 may be responsible for routing data signals from source resources in the emulation system that are not housed on the emulation chip 206a, to destination resources on the emulation chip 206a (e.g., processor clusters 304). In some cases, the data signals arrive at the IMUXES 406 through the serial buses 408, which may host data streams of serialized bits transmitted between the emulation chips 206 or emulation logic boards. The IMUXES 406 may, based on an IMUX instruction set stored in an IMUX instruction memory (not shown), receive data bits of a data stream from the serial buses 408, perform any number of logical operations on the data bits of the data stream, generate a set of output bits, output parallel data signals containing the set of bits, and route the parallel data signals to clusters 304 or specific processors on the emulation chip 206a. As mentioned, the IMUXES 206 may execute logical operations and routing functions based on an IMUX instruction set stored in an IMUX instruction store (not shown).

The ECS 302 is shown to be in communication with the serial buses 408 via control bus 412. It should be understood that the serial buses 408 may alternatively be configured to be a single serial bus as opposed to two separate ones. The ECS 302 may be used to control operation of the processor clusters 304 and/or other hardware or process operating thereon. The control bus 412 may operate in parallel with the parallel data lanes 410, thereby reducing load on the parallel data lanes 410 and allowing the ECS to operate independent from the MUXES 402, 404, and 406 in terms of communicating with the processor clusters 304.

ECS Overview and Example

Figure 5:
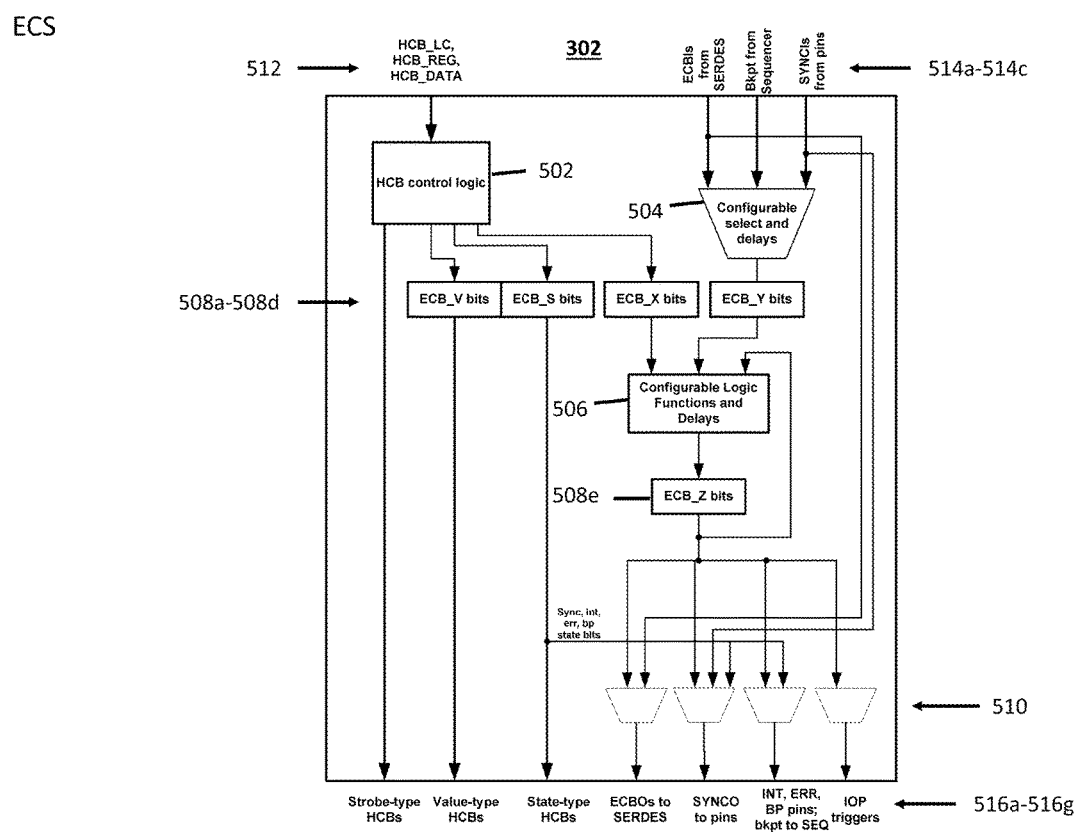
FIG. 5 is a schematic diagram of an illustrative enhance control system used to control operations on the emulator system.

With regard to FIG. 5, a schematic diagram of an illustrative enhance control system (ECS) 302 used to control operations on the emulator system is shown. In general, the ECS 302 allows signals from various sources (processors, serial links, pins, and IOPs) to be combined logically and redirected to other resources. The ECS 302 includes programmable or configurable logic, including HCB control logic 502, and configurable select and delays 504, configurable logic functions and delays 506. In one embodiment, the configurable devices may be programmed with machine-executable code that enables the configurable devices to perform the select, logic functions, and delays. The ECS 302 may also include operational parameters 508a-508e (collectively 508) that are outputs from the HCB control logic and multiplexer (502, 504, and 506). A register or memory (not shown) may be used to store the operational parameters 508. In one embodiment, rather than using an FPGA, the ECS 302 is configured using programmable MUXes 510, programmable function tables and delays 502, 504, and 506.

Hardware control bit inputs 512, including HCB_LC, HCB_REG, and HCB_DATA, may be received from other resources (e.g., processor clusters 304 and IOPs 306b) in the emulator chip 206 (FIG. 3). The HCB control logic 502 may be programmable logic that processes the HCB inputs 512 to generate outputs, including strobe-type HCBs 516a and embedded control bits ECB_V bits 508a, ECB_S bits 508b, and ECB_X bits 508c, as further described below. Additional inputs 514a-514c (collectively 514) into the ECS 302 may include ECBs from the SerDes 310, breakpoints (BRKPTs from the sequencer of the TCI 316, and SYNCIs from pins (not shown), respectively. These inputs 514 may be inputs into the multiplexer 504 configured to as a configurable select and delays (see, for example, FIG. 6).

HCBs

The strobe-type HCB 516a are output from the ECS 302 based on HCB controls 512. It is also possible to generate a pulse on a strobe-type HCB via an IOP instruction. Some strobes use an 8-bit address and 64-bit data, for example. Value-type HCBs 516b (ECB_V bits 508a) are set by HCB controls 512. It is also possible to set them via an IOP instruction from the IOPs 306b of FIG. 3. State-type HCBs 516c (ECB_S bits 508b) are set by HCB controls 512 from processors. It is also possible to set them via an IOP instruction from the IOPs 306b. ECB_S 508b bits are similar to ECB_V bits 508a, but may be selected to drive certain chip pins, such as INTERRUPT, ERROR, and SYNC_OUT. General purpose HCBs, including ECB_Xs 508c, are set by HCB controls from the processors. It is also possible to set the general purpose HCBs via an IOP instruction from the EDPs 306b. The general purpose HCBs used for ECB_Xs may have no predefined function, and are general purpose HCBs that can be used by virtual logic to communicate anything to other chips or the system via the ECS 302.

The configurable select and delays multiplexer 504 may receive chip inputs (ECB_Ys) 514, where the chip inputs 514 from off-chip. The chip inputs 514 are selectably chosen from any of (i) the ECBI embedded side-channel of the serial links 312, (ii) the SYNC_IN pins 514c of the chip which originate at the TCI FPGA 316, or (iii) from sequencer breakpoint signals 514b. The selection allows a programmable delay for delay balancing and system phase selection to be able to demultiplex the ECBs in a serial link.

Programmable Logic Outputs

ECB_X bits 508c and ECB_Y bits 508d may be combined using programmable logic to produce ECB_Z bits 508e. The input selects for the function can also select from the ECB_Z bits 508e themselves, which allows more complex functions to be built up by using some ECB_Z bits 508e as intermediate values for others. As programmable logic, a state machine may be implemented therein. An illustrative set of input to MUXes in the configurable logic functions and delays 506 are shown in TABLE 1.

TABLE I

| Inputs to MUXES | |
| --- | --- |
| Inputs | Assigned signals |
| 112-127 | all 1s |
| 96-111 | all 0s |
| 48-95 | ECB_Z |
| 16-47 | ECB_Y |
| 0-15 | ECB_X |

The signaling outputs of the ECS 302 generally select from the ECB_Z bits 508e. However, the outputs can also bypass the ECB_Z bits 508e and select from other signals related to their specialized purpose. Specifically, ECBO can select from the ECBIs, which permits loop-through operation of the serial inks. SYNC_OUT (SYNCO) pins 516e can be driven by SYNC_IN pins 514c or SYNCOUT HCBs (not shown). INT, ERR, BP pins 516f may be driven by associated HCBs.

Breakpoints

Breakpoints allow the emulator system 100 to cause a stoppage during execution of the emulation in the event that a certain or selectable condition is identified. The ECS 302 may be configured to receive two breakpoint signals—one from HCB 512 and one from sequencers 514b. Also, the ECS 302 generates two breakpoint signals, one to the TCI FPGA 316 and one to sequencers. A tci_breakpoint signal is sent to the TCI FPGA, and an hcb_breakpoint signal is communicated to the sequencers. These two output breakpoints are set based on the input breakpoints.

Ordinarily, in a single-chip mode, the step-generator function is performed by the sequencer, so the HCB from virtual logic is routed to hcb_breakpoint input of the sequencer. In multi-chip mode, the step-generator function is performed in TCI FPGA, so the HCB from virtual logic is routed to the chip output pin. As a result of setting a bit on a particular pin, the emulator circuit may be caused to advance one step, where steps occur between clock cycles.

There are two methods to generate a TCI breakpoint condition (e.g., tci_breakpoint) via hardware control bits HCBs. One method is to set a breakpoint using a breakpoint condition (e.g., breakpoint_byhcb) by a processor of any of the processor clusters 304. The other is set via a general purpose HCB 320 (e.g., GP_HCB[15:0]). GP_HCB becomes ECB_Xs 508c in the ECS 302, and then the embedded control bit can be part of ECB_Z bits 508e that is set by ECS programmable logic 506. ECB_Z bits 508e are sources of ECB outputs. A breakpoint signal may be communicated to the sequencers to stop issuing stepping commands.

ECS Control Example

An example of how the ECS 302 might be used is for simulation acceleration, where a host deposits data into multiple emulation chips 206 and then an emulation cycle executed thereafter. However, because there is no way to deter mine that multiple PCIe packets arrive at all the destinations before proceeding, the ECS 302 is used to ensure that the emulation or clock cycle does not proceed until each of the emulation chips 206 have received the PCIe packets, as follows (see, also, FIG. 3):

Each of the IOPs 306b receive data from the PCIe bus 110 applies the data to the appropriate internal resource, and then sets a general-purpose HCB 320 using to indicate RECEIVED. The ECS 302 may route RECEIVED in each chip to an ECB embedded in a serial link or to a SYNCOUT pin of the chip. These signals are routed using ECS (for ECBs) or TCI FPGA (for SYNC pins) up a predetermined tree to get all the RECEIVED signals to a central hub chip or a TCI FPGA.

The central hub logically combines all the RECEIVED signals into an ALL_RECEIVED signal. The ALL_RECEIVED signals may be routed back down to all the devices using ECBs or SYNC wire. (Note this can be done with balanced latency because the latencies are all known and the ECS can add programmed delays where needed.) When the ALL_RECEIVED signal is received at all chips, the chips can take the required action. For example, the chips may execute a cycle, or signal virtual logic (via HIBs) to apply buffers, etc.

The ECS 302 is intended to be flexible enough that the nature of the logic performed, the events which cause signals to be transmitted, and the action taken in response to signals may be modified long into the future as new needs and performance criteria arise. In one embodiment, the minimum latency is 2 cycles from inputs to outputs. Furthermore, internal registers in the ECS 302 can be overridden.

Figure 6:
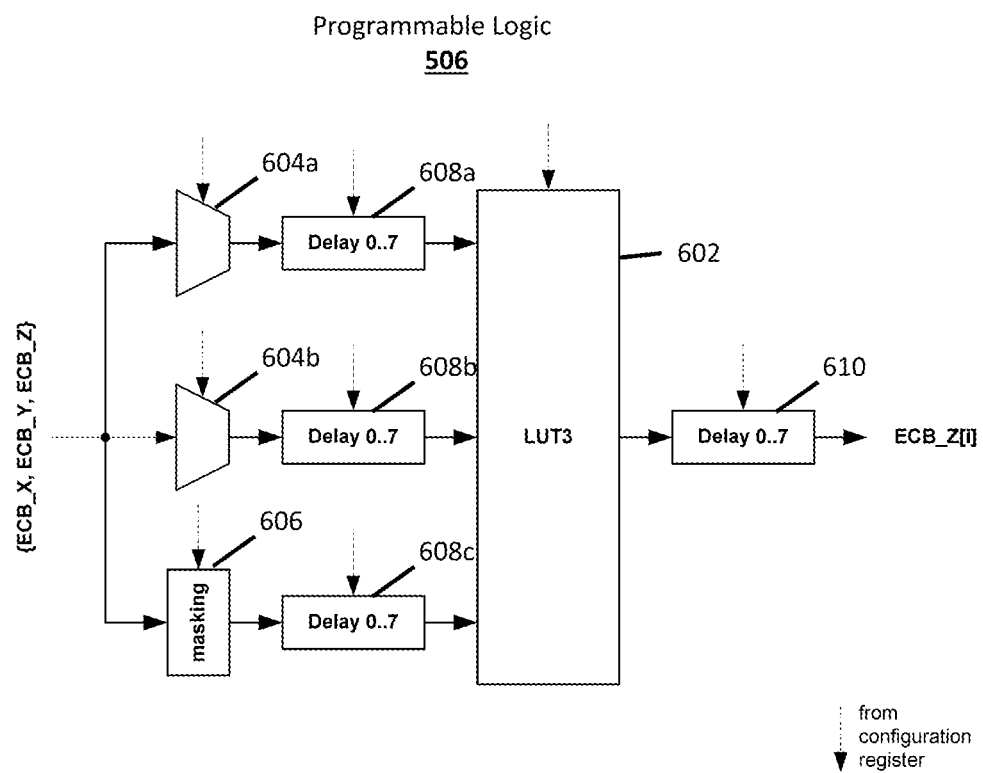
FIG. 6 is a schematic of illustrative programmable logic of FIG. 5.

With regard to FIG. 6, a schematic of illustrative programmable logic 506 (FIG. 5) is shown. The programmable logic 506 is configured with a lookup table 602 called a lookup table-3 (LUT3) as there are three inputs that may be used to look up an output value, in this case ECB_Z[i], as provided in TABLE II below:

The LUT3 602 receives three inputs, where two of the LUT3 inputs, selection from any bit in {ECB_X, ECB_Y, ECB_Z} may be made using selectors or multiplexers 604a and 604b, and a third input may be made using a full masking function 606 on the bits from inputs {ECB_X, ECB_Y, ECB_Z}, which can combine any subset of the bits with AND, OR, NAND or NOR. That is, the configurable logic may use logic gates (e.g., AND, NAND, NOR, or any other combinational logic) in determining whether and how to control the emulator circuit. As shown, programmable delays 608a-608c are included on each of the input lines to the LUT3 602 from the selectors 604a, 604b, and masking 606. In addition, a programmable delay 610 may be on the output of the LUT3 602. Each of the elements receive input from a configuration register that may cause certain functionality to be performed by the MUXes 604, masking 606, delays 608 and 610, and lookup table 602, as understood in the art.

TABLE II

LUT3 602 Truth Table

| Input | | | |
|---|---|---|---|
| C | B | A | Table L[7:0] |
| 0 | 0 | 0 | L[7] |
| 0 | 0 | 1 | L[6] |
| 0 | 1 | 0 | L[5] |
| 0 | 1 | 1 | L[4] |
| 1 | 0 | 0 | L[3] |
| 1 | 0 | 1 | L[2] |
| 1 | 1 | 0 | L[1] |
| 1 | 1 | 1 | L[0] |

NOTE that A is the least significant bit (LSB), and is an output of MUX_a, B is an output of MUX_b, and C is the most significant bit (MSB), is an output of the masking function. A register map (not shown) may be used to define the masking along with registers used for the masking. As an example, there may be 272 registers.

The foregoing method descriptions and the process flow diagrams are provided merely as illustrative examples and are not intended to require or imply that the steps of the various embodiments must be performed in the order presented. The steps in the foregoing embodiments may be performed in any order. Words such as "then," "next," etc. are not intended to limit the order of the steps; these words are simply used to guide the reader through the description of the methods. Although process flow diagrams may describe the operations as a sequential process, many of the operations can be performed in parallel or concurrently. In addition, the order of the operations may be re-arranged. A process may correspond to a method, a function, a procedure, a subroutine, a subprogram, etc. When a process corresponds to a function, its termination may correspond to a return of the function to the calling function or the main function.

The various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in teens of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

Embodiments implemented in computer software may be implemented in software, firmware, middleware, microcode, hardware description languages, or any combination thereof. A code segment or machine-executable instructions may represent a procedure, a function, a subprogram, a program, a routine, a subroutine, a module, a software package, a class, or any combination of instructions, data structures, or program statements. A code segment may be coupled to another code segment or a hardware circuit by passing and/or receiving information, data, arguments, parameters, or memory contents. Information, arguments, parameters, data, etc. may be passed, forwarded, or transmitted via any suitable means including memory sharing, message passing, token passing, network transmission, etc.

The actual software code or specialized control hardware used to implement these systems and methods is not limiting of the invention. Thus, the operation and behavior of the systems and methods were described without reference to the specific software code being understood that software and control hardware can be designed to implement the systems and methods based on the description herein.

When implemented in software, the functions may be stored as one or more instructions or code on a non-transitory computer-readable or processor-readable storage medium. The steps of a method or algorithm disclosed herein may be embodied in a processor-executable software module which may reside on a computer-readable or processor-readable storage medium. A non-transitory computer-readable or processor-readable media includes both computer storage media and tangible storage media that facilitate transfer of a computer program from one place to another. A non-transitory processor-readable storage media may be any available media that may be accessed by a computer. By way of example, and not limitation, such non-transitory processor-readable media may comprise RAM, ROM, EEPROM, CD-ROM or other optical disk storage, magnetic disk storage or other magnetic storage devices, or any other tangible storage medium that m.ay be used to store desired program code in the form of instructions or data structures and that may be accessed by a computer or processor. Disk and disc, as used herein, include compact disc (CD), laser disc, optical disc, digital versatile disc (DVD), floppy disk, and blu-ray disc where disks usually reproduce data magnetically, while discs reproduce data optically with lasers. Combinations of the above should also be included within the scope of computer-readable media. Additionally, the operations of a method or algorithm may reside as one or any combination or set of codes and/or instructions on a non-transitory processor-readable medium and/or computer-readable medium, which may be incorporated into a computer program product.

The preceding description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the following claims and the principles and novel features disclosed herein.

While various aspects and embodiments have been disclosed, other aspects and embodiments are contemplated. The various aspects and embodiments disclosed are for purposes of illustration and are not intended to be limiting, with the true scope and spirit being indicated by the following claims.

What is claimed is:

1. An emulation system comprising:
a serial bus interconnecting first and second emulation chips;
one or more serial link inputs of the second emulation chip and communicatively coupled to the serial bus, a serial link input configured to receive an unscheduled input control bit asynchronous to the clock cycle of the emulation system from the serial bus, the unscheduled input control bit generated by the first emulation chip; and
a configurable logic circuit of the second emulation chip, wherein the configurable control logic circuit is configured to receive a plurality of unscheduled input control bits from the one or more serial link inputs, execute one or more operations on the plurality of unscheduled input control bits according to programmable logic, and transmit an output control bit to a serial output link.

2. The system according to claim 1, wherein the one or more operations are stored into a configuration register by a compiler upon compiling a netlist and one or more coding inputs representing the one or more operations.

3. The system according to claim 1, further comprising a configuration register comprising non-transitory machine-readable storage media configured to store the one or more operations executed by the configurable logic circuit.

4. The system according to claim 3, wherein the configuration register receives machine-readable code containing an operation from a workstation computer.

5. The system according to claim 3, wherein the configuration register is configured prior to executing an emulation.

6. The system according to claim 1, wherein the control circuit transmits the output control bit irrespective of a synchronization instruction received from a synchronization circuit of the emulation system.

7. The system according to claim 1, wherein the serial output link is a synchronization output link configured to instruct the configurable logic circuit to execute one or more operations.

8. The system according to claim 1, wherein the configurable logic circuit is configured to generate a breakpoint output, according to a breakpoint operation in the one or more operations.

9. The system according to claim 1, wherein the configurable logic circuit comprises a lookup table.

10. The system according to claim 9, further comprising at least one selectable delay circuit prior to the lookup table and a delay circuit after the lookup table to delay output of the lookup table.

11. The system according to claim 10, further comprising at least one selectable delay circuit prior to the lookup table and a delay circuit before the lookup table to delay input into the lookup table.

12. A processor-implemented method of controlling an emulator, comprising:
    receiving, by a control circuit of an emulation chip, one or more unscheduled input control bits asynchronous to the clock cycle of the emulator from a serial bus;
    executing, by the control circuit, one or more operations on the one or more unscheduled input control bits according to programmable logic;
    generating, by the control circuit, an output control bit based on the one or more operations; and
    transmitting, by the control circuit, the output control bit to a serial output link.

13. The method according to claim 12, further comprising:
    receiving, by the control circuit, the one or more operations from a configuration register comprising non-transitory machine-readable storage configured to store the one or more operations.

14. The method according to claim 12, wherein generating an output control bit based on the one or more operations further comprises:
    generating, by the control circuit, a breakpoint output according to a breakpoint operation of the one or more operations.

15. The method according to claim 12, wherein executing the one or more operations further comprises:
    accessing, by the control circuit, a lookup table containing an indicator of the control output bit based on the one or more unscheduled input control bits,
    wherein the control circuit generates a control output bit for the one or more control output bits upon determining the indicator of the control output bit using the one or more unscheduled input control bits.

16. The method according to claim 15, further comprising delaying input into the lookup table of at least one unscheduled control input bit.

17. The method according to claim 15, further comprising delaying output from the lookup table of the at least one control output bit.

18. The system according to claim 12, wherein generating the output control bit further comprises:
    generating, by the control circuit, a synchronization bit based on a synchronization operation of the one or more operations; and
    wherein the control circuit transmits the synchronization bit over the serial bus to second control circuit of the emulation system.

* * * * *